United States Patent [19]

Ikeya

[11] Patent Number: 5,628,635
[45] Date of Patent: May 13, 1997

[54] TEST SOCKET FOR AN INTEGRATED CIRCUIT

[75] Inventor: Kiyokazu Ikeya, Suntoh-gun, Japan

[73] Assignee: Texas Instruments Incorporated, Dallas, Tex.

[21] Appl. No.: 400,208

[22] Filed: Mar. 7, 1995

[30] Foreign Application Priority Data

Mar. 16, 1994 [JP] Japan .................. 6-071675

[51] Int. Cl.$^6$ .................................................. H01R 9/09
[52] U.S. Cl. .......................... 439/70; 439/515; 439/526
[58] Field of Search ........................ 439/68, 70–73, 439/525, 526, 515

[56] References Cited

U.S. PATENT DOCUMENTS

| | | | |
|---|---|---|---|
| 3,345,541 | 10/1967 | Cobaugh et al. | 439/526 |
| 4,362,353 | 12/1982 | Cobaugh | 439/70 |
| 4,370,017 | 1/1983 | Grabbe | 439/635 |
| 4,511,197 | 4/1985 | Grabbe | 439/71 |
| 4,513,353 | 4/1985 | Bakermans et al. | 439/71 |
| 4,623,208 | 11/1986 | Kerui et al. | 339/74 |
| 4,647,124 | 3/1987 | Kandybowski | 439/515 |
| 4,684,184 | 8/1987 | Grabbe et al. | 439/71 |
| 4,699,593 | 10/1987 | Grabbe et al. | 439/71 |
| 4,715,823 | 12/1987 | Ezura et al. | 439/267 |
| 4,750,890 | 6/1988 | Dube et al. | 439/152 |
| 4,887,969 | 12/1989 | Abe | 439/73 |
| 4,906,194 | 3/1990 | Grabbe | 439/71 |
| 4,940,432 | 7/1990 | Consoli et al. | 439/72 |
| 4,941,832 | 7/1990 | Korsunsky et al. | 439/71 |
| 4,995,817 | 2/1991 | Grabbe | 439/70 |
| 5,067,904 | 11/1991 | Takeuchi et al. | 439/72 |
| 5,076,798 | 12/1991 | Uratsuji | 439/269.1 |
| 5,147,212 | 9/1992 | Uratsuji et al. | 439/266 |

FOREIGN PATENT DOCUMENTS 457472   11/1991   European Pat. Off. .

OTHER PUBLICATIONS

Patent Abstracts of Japan, vol. 18, No. 31, (P–1677), 18 Jan. 1994 & JP–A–05 264653 (Taya Krnichi) 12 Oct. 1993.
Patent abstracts of Japan, vol. 15, No. 219 (E–1074), 5 Jun. 1991 & JP–A–03 064037 (Matsui Yoshihiro) 19 Mar. 1991.
JEE Journal of Electronic Engineering, vol. 29, No. 302, 1 Feb. 1992, pp. 59–61, XP 000287652, Masaaki Saito "SMT–Use IC Sockets Come Into Play as Electronic Parts Shrink".

*Primary Examiner*—Neil Abrams
*Attorney, Agent, or Firm*—Russell E. Baumann; Richard L. Donaldson; René E. Grossman

[57] ABSTRACT

A socket has a main socket body 10 and a plurality of contact members 12 adapted for making electrical contact with electrical parts (20, 30) of both small outline package (SOP) type and small outline J-leaded package (SOJ) type. The contact members 12 have a base part 12a that is fixed in the main socket body, a contact part (12d, 12e and 12f) which guides and makes pressure contact with the connection terminals (22, 32) of the electrical part (20, 30) and a connective part 12c which integrally connects the base part (12a) and the contact part (12d, 12e and 12f). Each contact also includes a spring reinforcement and current bypass part (12h). The contact part further includes an upper guide portion (12f), a lower guide portion (12d) and a contact portion (12e).

8 Claims, 11 Drawing Sheets

PRIOR ART

TEST SOCKET FOR AN INTEGRATED CIRCUIT

FIELD OF THE INVENTION

This invention relates to a socket for removably loading an electrical part such as the IC package, etc., to obtain an electrical contact with the electrical part.

BACKGROUND OF THE INVENTION

It is standard procedure to test integrated circuit (IC) packages which include an IC chip that is resin-sealed to assure that it is an acceptable product. Typically, IC packages are first subjected to an electrical properties test in which the input/output characteristics, pulse characteristics and noise leeway, etc., of the IC chip are tested. Then, those IC packages which have passed the electrical property test are placed in an oven and caused to operate for a certain period of time at a source voltage which is approximately 20 percent higher than the rated value at a relatively high temperature such as 120 degrees centigrade. Those IC packages which fail this burn-in test are dropped as being unsatisfactory and only those IC packages which performed acceptably are shipped out as being satisfactory.

IC packages currently are moving from a terminal insertion type such as the DIP (dual in-line package), etc., to a surface mount type such as a SOP (small outline package), a SOJ (small outline J-leaded package) and a QFP (quad flat package).

Figure 12A:
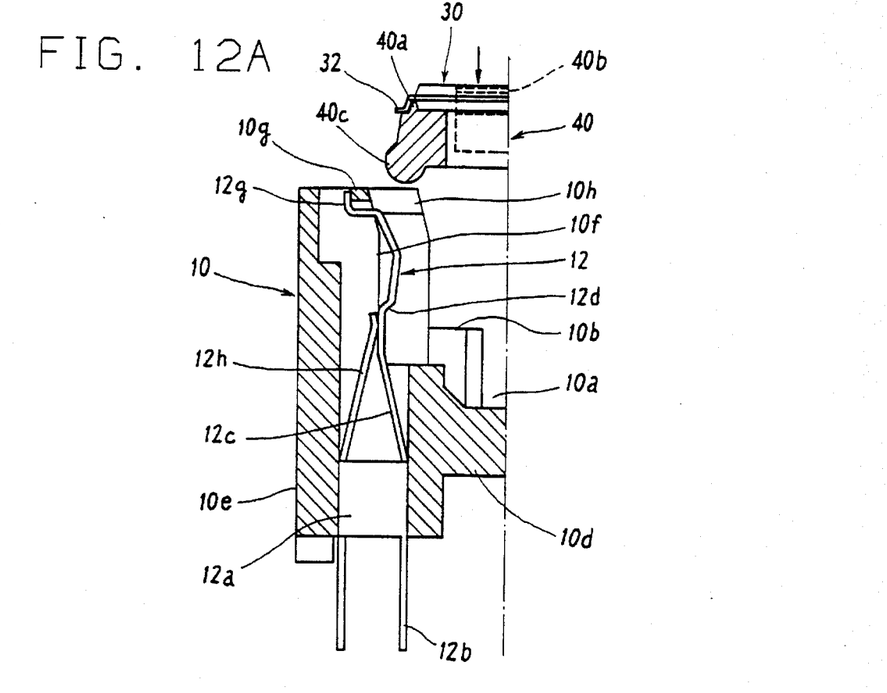
FIGS. 12A to 12E show various positions of the contact of FIG. 5A in the main socket body when an SOP IC package with carrier is loaded into the socket of the present invention.
Figure 12B:
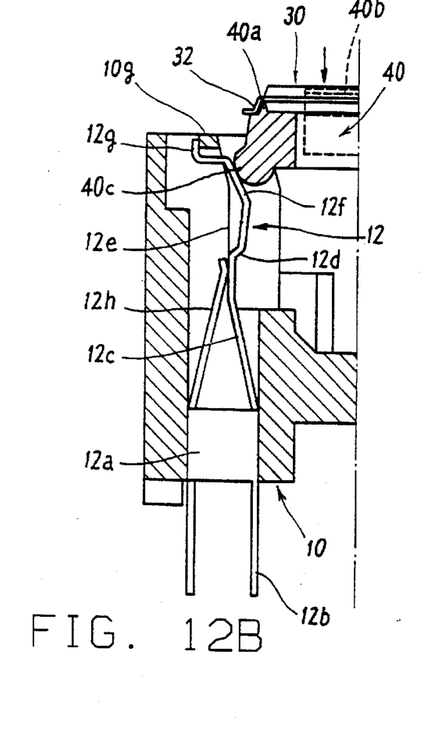
Figure 12C:
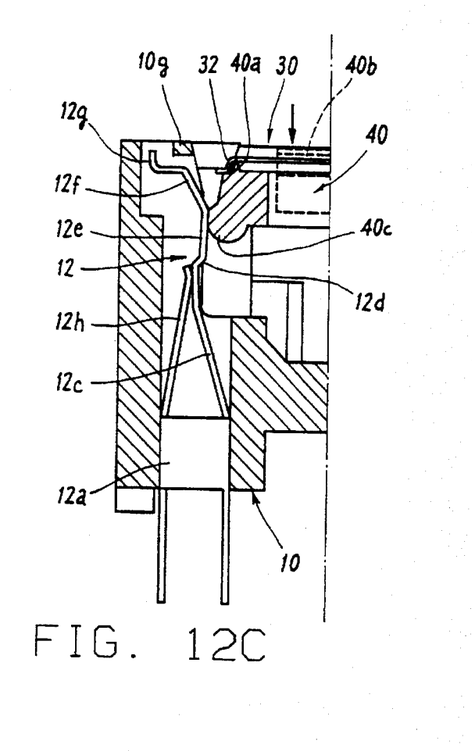
Figures 12D, 12E, 13:
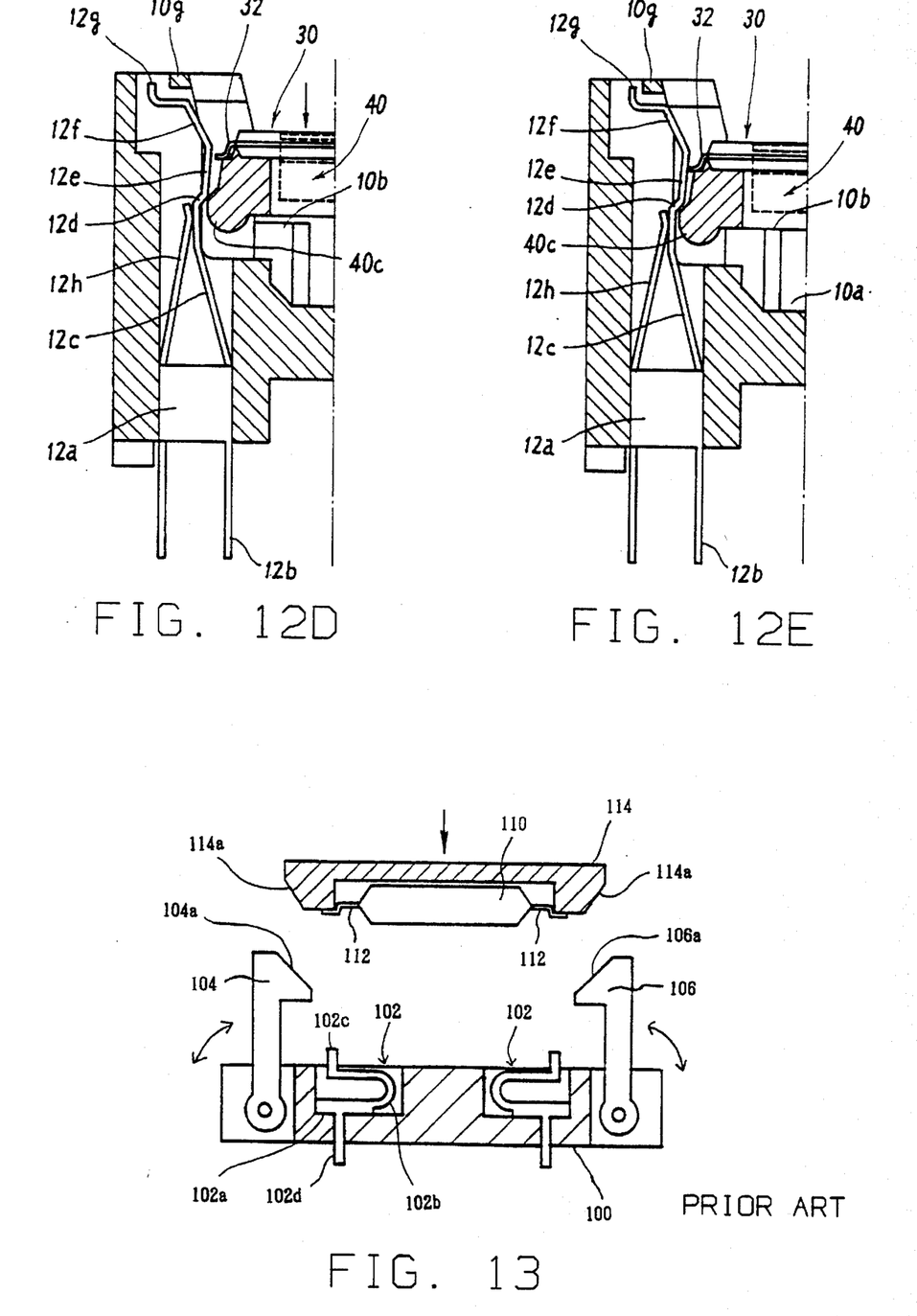
FIG. 13 shows a cross-section of a socket according to prior art before loading a SOP type IC package.
Figure 14:
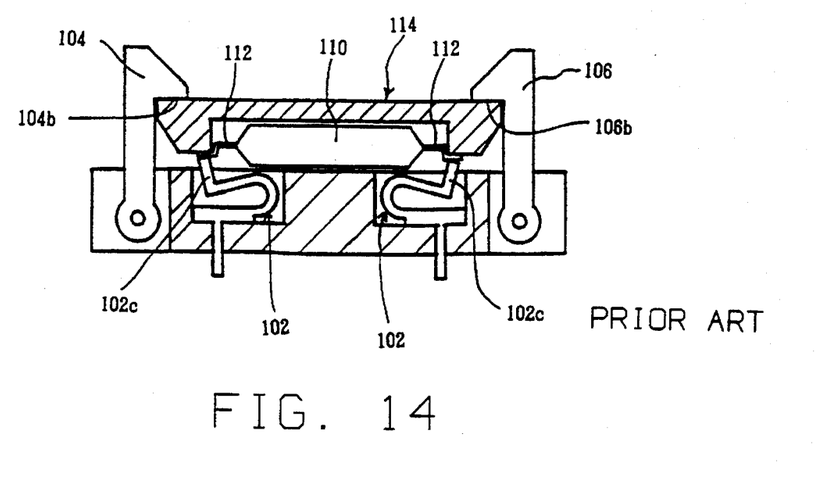
FIG. 14 shows a cross-section of the socket of FIG. 13 after loading a SOP type IC package.

FIGS. 13 and 14 show the construction of a socket for the burn-in test according to prior art adapted for loading an IC package 110 of the SOP type.

In this socket, a large number of pin type contacts 102 are arranged at locations corresponding to gull-wing type leads 112 of IC package 110 of the SOP type that is to be loaded on a base 100 of the main socket body. Each contact 102 has a base end 102a which is fixed to base 100, a curved spring part 102b which extends upward in a curved manner in the shape of J from this base end 102a, a contact part 102c which extends vertically upward from the tip of this curved spring part 102b and a connector 102d that protrudes downward through the base 100 from the base end 102a. Additionally, in base 100, a pair of latches 104 and 106b for holding the IC package in place when mounted on the socket are rotatably installed outside both contact rows. Each latch is rotatably biased toward the center of the base by a spring (which is not shown in the drawing).

IC package 110 is loaded onto base 100 while being held on the inner or under side of a carrier 114 whose cross-section is generally in the shape of U. As is shown in FIG. 13, when carrier 114 is inserted with IC package 110, the tapered surface 114a outside the lower part of the carrier 114 contacts the tapered surfaces 104a and 106a inside the tops of the latches 104 and 106 thereby being guided downward by the latches 104 and 106, and causing them to rotate outward in opposition to a spring bias force so that each lead 112 of the IC package 110 is placed atop each corresponding contact 102.

If the carrier 114 is further pushed in opposition to the spring force of the contact 102, the latches 104 and 106 are restored to the original positions as is shown in FIG. 14 with a result that respective upper claw parts 104b and 106b engage with the upper peripheral edge of carrier 114. As a result of the hold-down force on carrier 114 in this state, a reliable electrical contact is obtained between each lead 112 of the IC package 110 and each corresponding contact 102.

Figure 15:
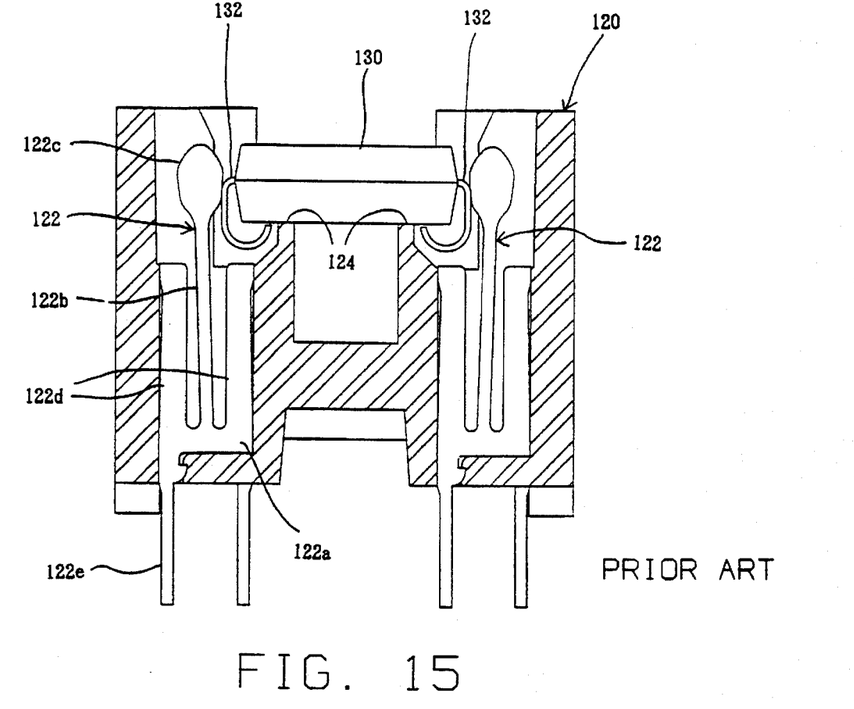
FIG. 15 shows a cross-section of another socket according to prior art after loading a SOJ type IC package.

FIG. 15 shows the construction of a socket for the burn-in according to prior art for loading IC package 130 of the SOJ type.

In this SOJ socket, a large number of erect type contacts 122 are arranged at locations corresponding to J-shape leads 132 of IC package 130 to be loaded in a base 120 of a main socket body. Each contact 122 arranged in rows has a base end 122a which is fixed to the base 120, a straight-line spring part 122b which extends vertically from the center of this base end 122a, a wide contact part 122c that is formed at the distal end of straight-line spring part 122b, support parts 122d which extends vertically upward from both ends of the base end 122a parallel flanking straight-line spring part 122b and a contact pin 122e that protrudes downward through base 120 from one end of base end 122a. In the base 120, a flange 124 for placing the IC package is provided inside both contact rows.

IC package 130 is inserted into the base 120 without using a carrier with leads 132 facing down as is shown in the drawing. As IC package 130 is mounted on the base, the outer side of each lead 132 slides against the inside end of contact part 122c of each contact 122 with a consequence that the straight-line spring part 122b of each contact 122 is elastically displaced outward. Upon the lower surface of the IC package 130 being placed on the flange 124, a suitable elastic pressure contact and corresponding electric contact are obtained between each lead 132 and contact part 122c of each contact 122.

As illustrated and described above, separate socket having a different construction needs are used for an SOP type IC package and a SOJ IC package. This has been the case even when the SOP and SOJ type packages have the same arrangement pattern for the leads, thus, resulting in higher overall costs. Additionally, in the case of sockets for SOP packages, additional parts such as latches are needed.

SUMMARY OF THE INVENTION

Accordingly, it is an object of the present invention of providing a socket which can be used both for electrical parts of the SOP type having a gull-wing type connection terminal and of the SOJ type having a J-type connection terminal.

It is another object of the present invention of providing a socket having a simple construction with a small number of parts and yet capable of stably and accurately loading the electrical part.

Briefly, a socket according to this invention is used for mounting an electrical part in a freely detachable manner in which the electrical part is of a SOJ type with a plurality of connection terminals that extend in the shape of a "J" adapted for use in the socket without a carrier member and of the SOP type with a plurality of connection terminals that extend in a gull-wing shape adapted for use in the socket with a carrier member. The socket comprises a main socket body for receiving the electrical part and a plurality of contact members which have been arranged at prescribed locations inside the main socket body so that each may be electrically connected in a one to one relationship with one of said plurality of connection terminals of the electrical part, and is characterized in that each of said plurality of contact members has a base part that is fixed in the main socket body, a contact part which guides and makes pressure contact with one of said plurality of connection terminals of said electrical part while being elastically displaced, and a connective part which integrally connects the base part and the contact part.

Further, in accordance to a socket of this invention, the contact part has an upper guide portion, a lower guide portion and a contact portion.

Still further, in accordance to a socket of this invention, the connective part extends from one end of the base part and an auxiliary connective part extends from the other end of the base portion and connects with the connective part.

BRIEF DESCRIPTION OF THE DRAWINGS

Other objects, advantages and details of this invention appear in the following detailed description of the preferred embodiments of the invention, the detailed description referring to the drawings in which.

DETAILED DESCRIPTION OF THE PREFERRED EMBODIMENTS

Figure 1:
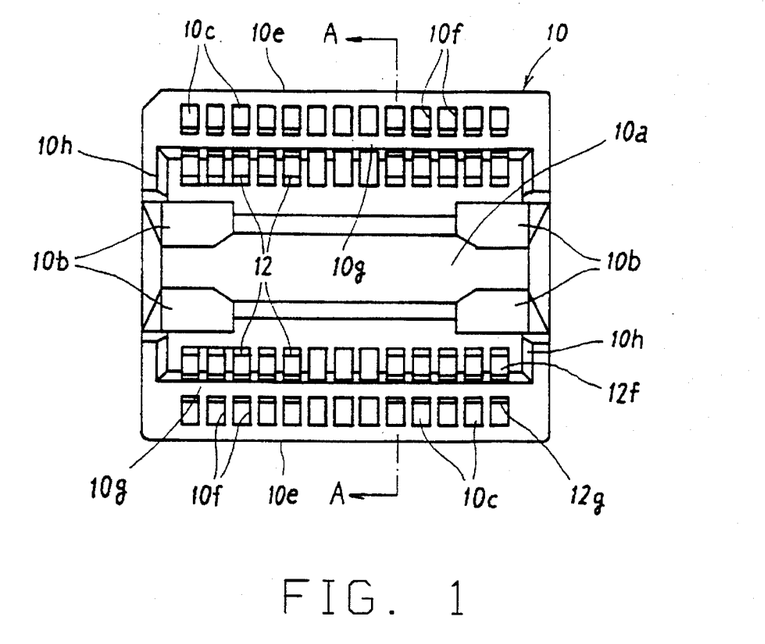
FIG. 1 is a plane view showing a construction of the main socket body of a socket described in a first embodiment of this invention.
Figure 2:
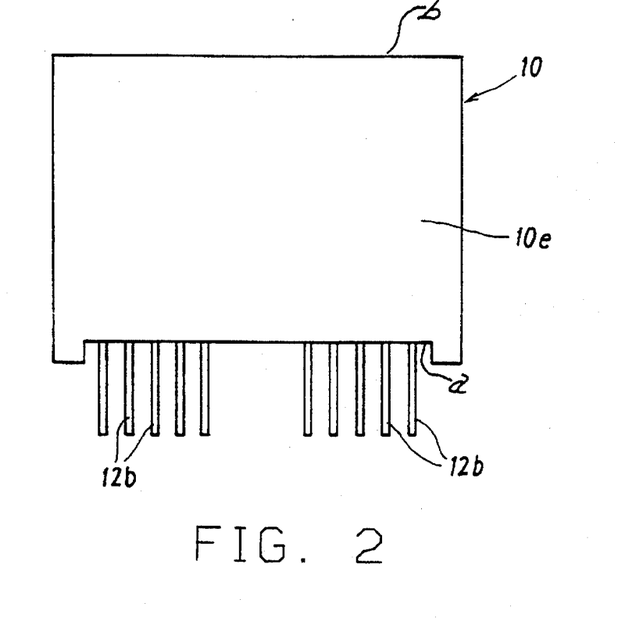
FIG. 2 is a front view of the main socket body of FIG. 1.
Figure 3:
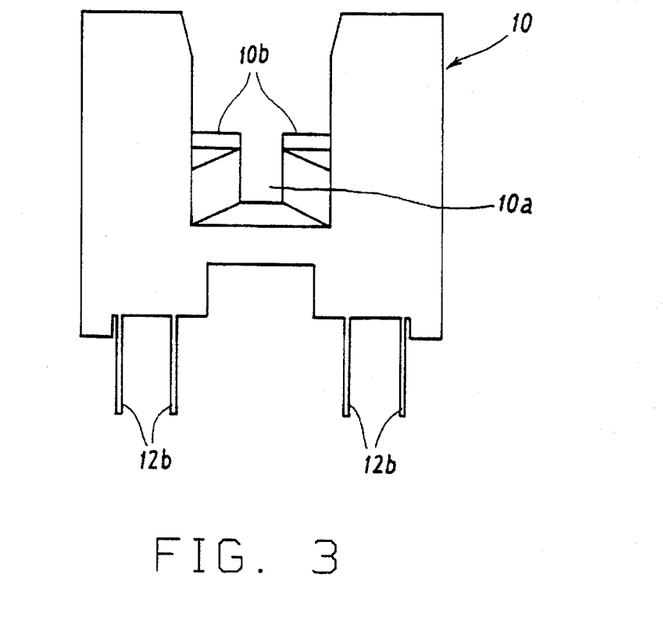
FIG. 3 is a side view of the main socket body of FIG. 1.
Figure 4:
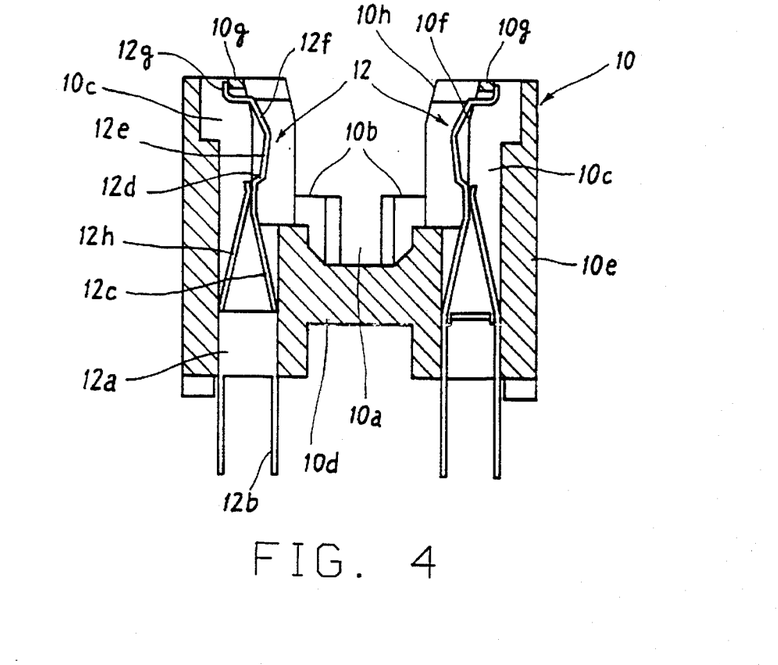
FIG. 4 is a cross-section view cut along line A—A in FIG. 1.

FIGS. 1–5 show the construction of a main socket body 10 according to an embodiment of this invention with FIG. 1 being a plane figure, FIG. 2 a front view, FIG. 3 a side view and FIG. 4 a cross-section cut along line A—A in FIG. 1.

Main socket body or base 10 in this embodiment has a construction in which a lower surface a is placed against a printed substrate (not shown) with an IC package of a SOP type or a SOJ type being loaded on an upper surface b. As is shown in FIGS. 1, 3 and 4, a groove or cavity 10a is formed in the longitudinal direction at the center of base 10. At the four corners of this cavity 10a, flat-surface carrying parts 10b are provided at positions which are higher than the bottom of the cavity 10a. Further, a large number of contact receiving cavities 10c are provided in a row in the outer side walls of the socket base at a prescribed pitch in the longitudinal direction of the base.

Socket base 10 additionally comprises a base bottom plate 10d, base side wall 10e, partition wall 10f and upper end stoppers 10g. In the longitudinal direction of base 10, a base end wall 10h is provided for guiding or positioning the IC package and extends inward from the base side wall 10e to a position which is nearer the center than the inner wall of contact receiving cavity 10c.

A contact 12 is positioned in each contact receiving cavity 10c as is shown in FIG. 4. Contact 12 is formed with a base end part 12a, a contact pin 12b that protrudes downward from this base end part 12a, a main linkage part 12c which stands almost vertically at the top after extending obliquely upward in a straight line toward the base side wall 10e from an inside end part of base end part 12a, a lower guide part 12d which extends obliquely toward the base interior from the top of the main linkage part 12c, a contact part 12e that extends vertically upward from the tip of the lower guide part 12d, an upper guide part 12f that extends obliquely upward toward base side wall 10e from the top of the contact part 12e, engagement part 12g that extends upward in the shape of L from the tip of the upper guide part 12f, and an auxiliary linkage part 12h which extends obliquely upward in a straight line from base end part from the side adjacent base side wall 10e and which connects with the top end of the main linkage part 12c. In the contact 12, the upper guide part 12f, the contact part 12e and the lower guide part 12d are the parts which come into contact with the IC package or the carrier as will be described later. Additionally, engagement part 12g is in engagement with an upper stopper part 10g of base 10 at the upper opening of cavity 10c.

In base 10, contact pins 12b are arranged between the mutually facing contacts 12 in a zigzag fashion between contacts 12 in each contact row with cavity 10a being sandwiched there between. Each contact pin 12b is inserted into a through-hole of a printed substrate (not shown).

Figure 5A:
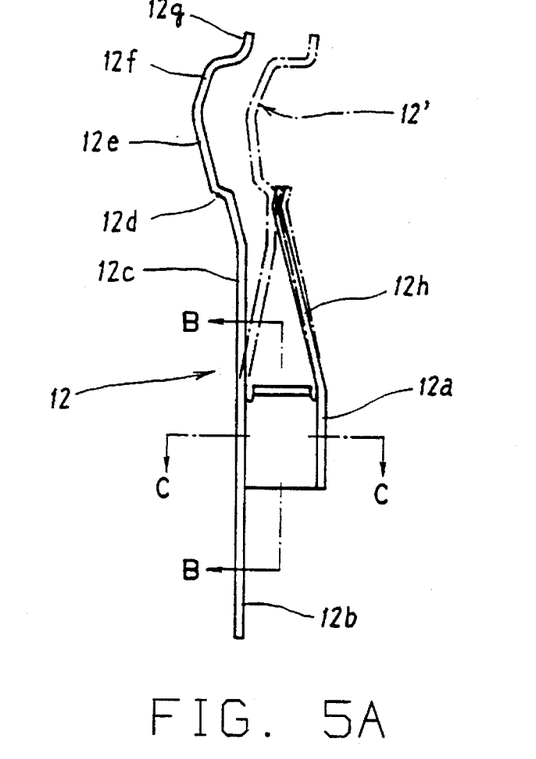
FIG. 5A shows a front view of a contact for use in the main socket body of FIG. 1.
Figure 5B:
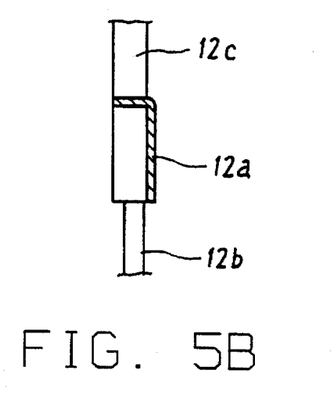
FIG. 5B shows a cross-section view cut along line B—B of FIG. 5A.
Figure 5C:
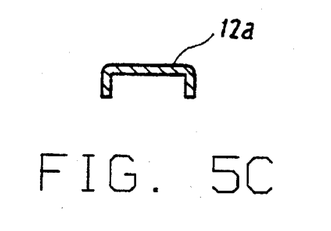
FIG. 5C shows a cross-section view along line C—C of FIG. 5A.

FIG. 5 shows the shape of the contact 12 before it is positioned into the contact receiving cavity 10c (in its original shape). FIG. 5 is a front view, FIG. 5B shows a cross-section cut along line B—B in FIG. 5A and FIG. 5C is a cross-section cut along line C—C in FIG. 5A. The contact in this example is prepared by the extrusion of a thin sheet of electrically conductive material such as beryllium copper or the like.

As is shown in FIG. 5A, the main linkage part 12c in this state extends almost vertically upward with the tip of the auxiliary linkage part 12h being separated from the main linkage part 12d. When contact 12 is accommodated in the contact receiving cavity 10c, part 12g is engaged with upper stopper 10g on the side of the base 10; and as is shown by chain line 12', the spring part from the upper guide part 12f toward the main linkage part 12c is elastically displaced toward auxiliary linkage part 12h, thereby assuming a position as shown in FIG. 4.

Figure 6A:
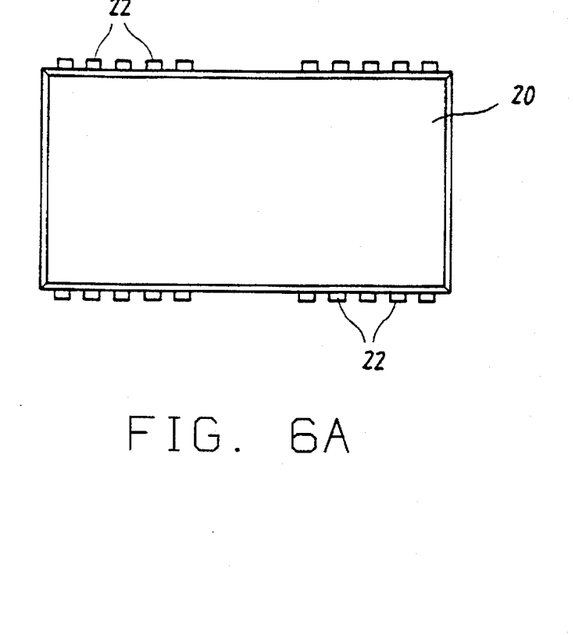
FIGS. 6A, 6B and 6C show a plane view, a side view and an end view of a SOJ IC package.
Figure 6B:
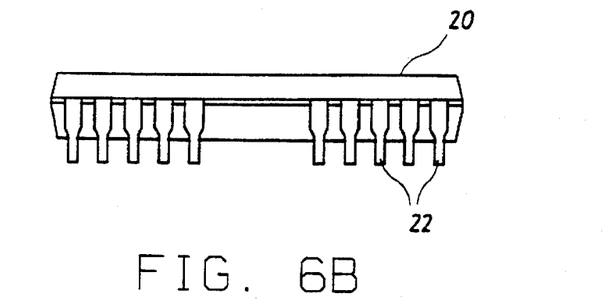
Figure 6C:
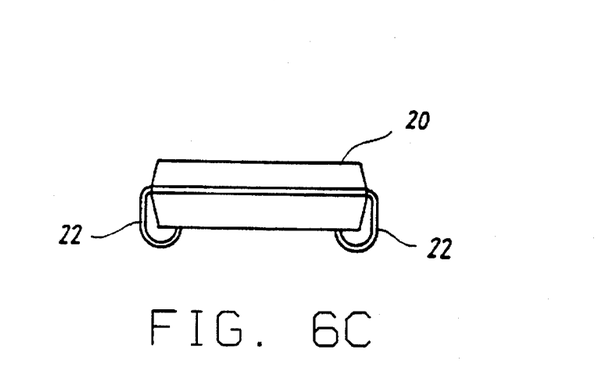

FIG. 6 shows the construction of an SOJ type IC package that can be loaded in the socket of the present invention. FIG. 6A is a plane figure, FIG. 6B is a front view and FIG. 6C is a side view.

As is shown in the drawing, the SOJ type IC package consists of a rectangular parallelepiped package whose thickness is comparatively large. From both sides of the longitudinal side of the package, a large number of J-shaped leads 22 protrude at a constant pitch corresponding both in number and pitch as the number of contacts 12 inside base 10.

It is mentioned in this connection that in the drawings, the lead row of the IC package is cut at the center and the contact row inside the main socket body (base) is also cut at the center; but that pattern of the lead and contact arrangements is merely one example and other patterns could be equally well used.

The function of the socket in this invention in the loading of an SOJ type IC package will be explained by referring to FIGS. 7A-7F. Since the socket and the SOJ type IC package 20 are constructed in such a way that they are symmetrical along the longitudinal center axis, FIG. 7 shows only the left half construction.

Figure 7A:
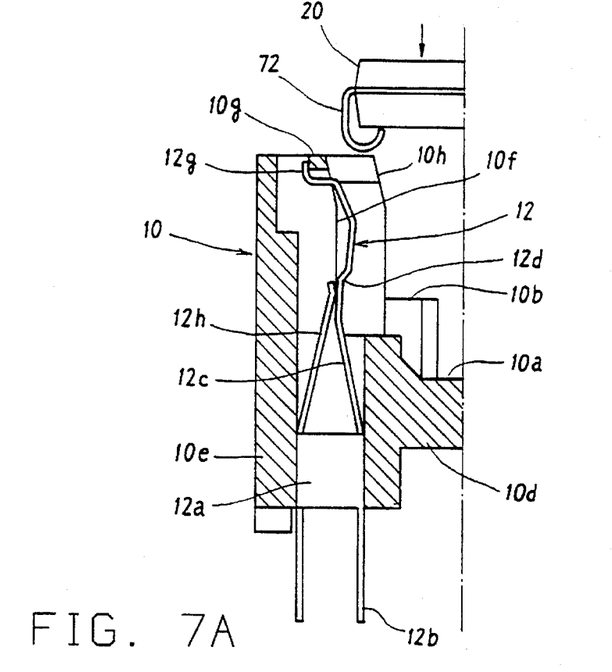
FIG. 7A–7E show various positions of the contact of FIG. 5A in the main socket body when a SOJ type IC package is loaded into the socket of the present invention.

As is shown in FIG. 7A, the SOJ type IC package 20 is first positioned by means of a tool, carrier arm etc., (not shown in the drawing) immediately above the main socket body so each J-shaped lead 22 is positioned above a corresponding contact 12.

Figure 7B:
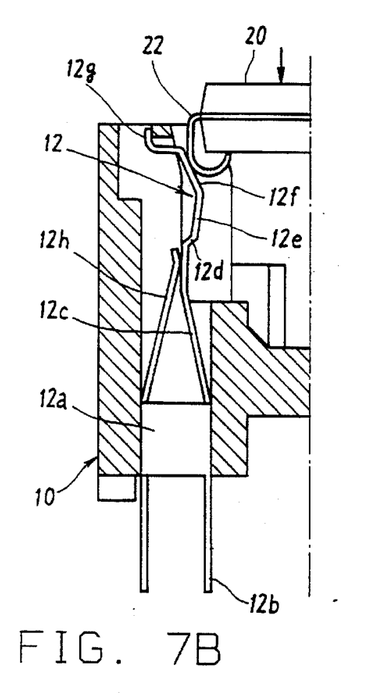

As the SOJ type IC package is vertically lowered, the outer surface of each J-shaped lead 22 contacts the upper guide part 12f of each contact 12 as shown in FIG. 7B.

Figure 7C:
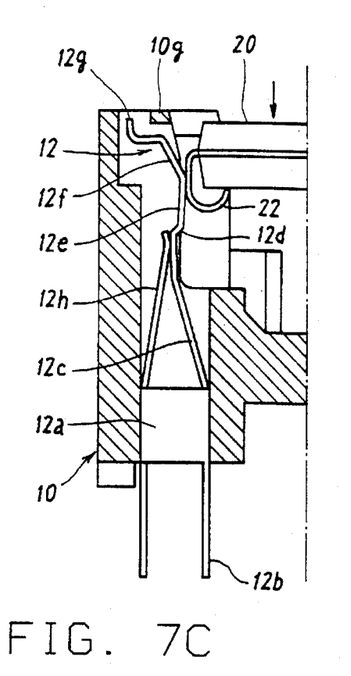

As the package is further pushed down, the outer surface of each J-shaped lead 22 slides downward along the upper guide part 12f of each contact 12 and each part 12c through 12h above base end 12a of each contact 12 is elastically displaced outward by the pressure from the insertion of the package 20. As is shown in FIG. 7C, moreover, the surface that slides along the outer surface of each J-shaped lead 22 moves from the upper guide part 12f to contact part 12e of each contact 12.

Figure 7D:
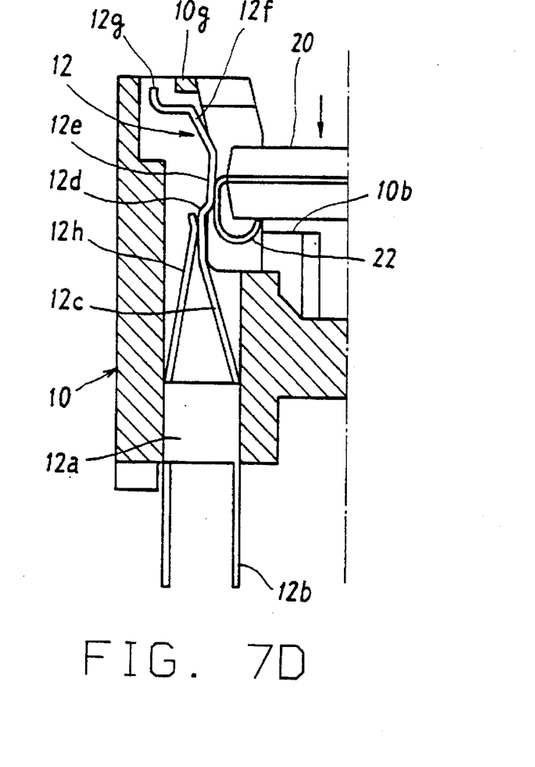
Figure 7E:
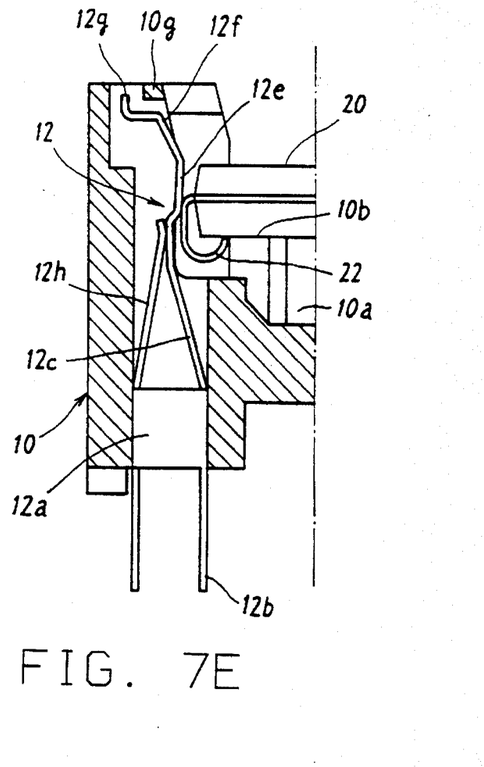

As shown in FIGS. 7D and 7E, the SOJ package and each J-shaped lead 22 continues to slide along contact part 12e until the lower surface of package 20 rests on carrier stand 10b. In this state, SOJ type IC package 20 is loaded into the main socket and it is subjected to a burn-in test.

In the loaded state, the base end part of the J-shaped lead 22 contacts the lower end of contact part 12e of each contact 12. In this position, IC package 20 remains pressed to the carrier stand 10b by the elastic reaction of contact 12. It is stably held at the loaded position even if the external pressure or holding force is removed because the elastic reaction of contact 12 applies a force obliquely downward toward the interior of the socket.

During the burn-in test, the electric current flows through the various parts 12e, 12c, 12h, 12a and 12b of contact 12 which are below the point of connection with the J-shaped lead 22. The auxiliary linkage part 12h functions not only for increasing the spring force of the contact 12 against the IC package but also as a current bypass.

In the case of an SOJ type package, moreover, the J-shaped lead 22 slides only along the upper guide part 12f and the contact part 12e and does not contact the lower guide part 12d.

In order to take out the IC package 20 from this socket, it is only necessary to insert a tool such as an arm, etc., into the cavity 10a of base 10 and grip the lower side of IC package 20 and raise it in a vertically upward direction. Upon removal, each J-shaped lead 22 moves upward in the order of FIGS. 7E through 7A; and at the same, each contact 12 is restored to its original position.

Figure 8A:
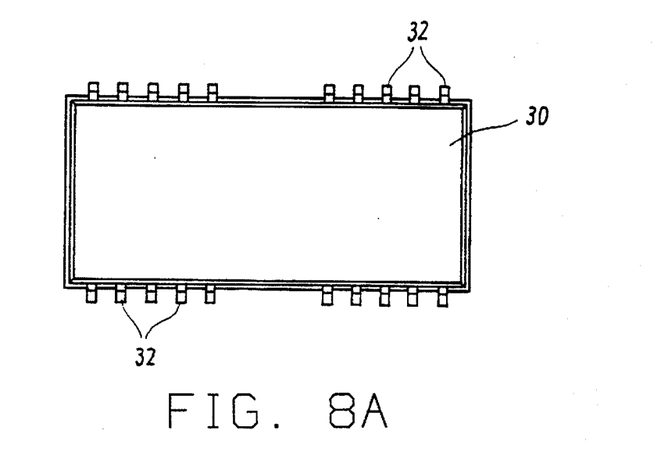
FIGS. 8A, 8B and 8C show a plane view, a side view and an end view of a SOP IC package.
Figure 8B:
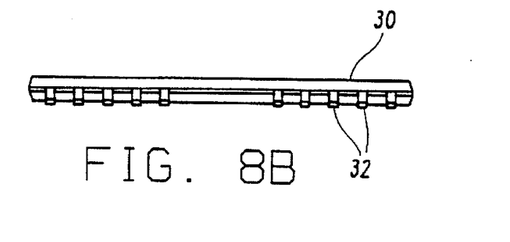
Figure 8C:
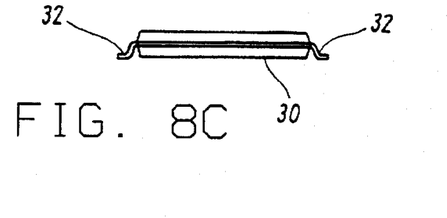

FIG. 8 shows the construction of an SOP type IC package 30 that can be loaded into the socket of this invention. FIG. 8A is a plane figure, FIG. 8B is a front view and FIG. 8C is a side view. As is shown in the figures, this SOP type IC package 30 is a rectangular package, comparatively shallow and having a plane size which is approximately the same as the aforementioned SOJ type IC package 20. As with package 20, from both sides of the longitudinal side of the package, a large number of leads 32 protrude at a predetermined pitch corresponding to the number and pitch of contacts 12. Leads 32 are of a gull-wing shape.

Figure 9A:
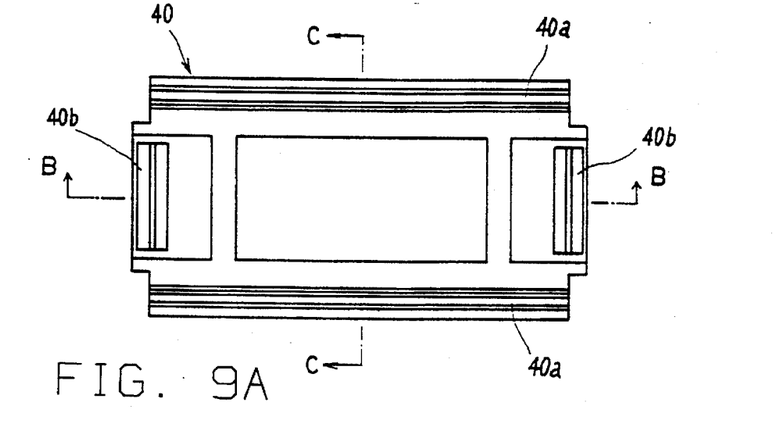
FIG. 9A shows a plane view of a carrier used for loading a SOP type IC package into the main socket body of FIG. 1.
Figure 9B:
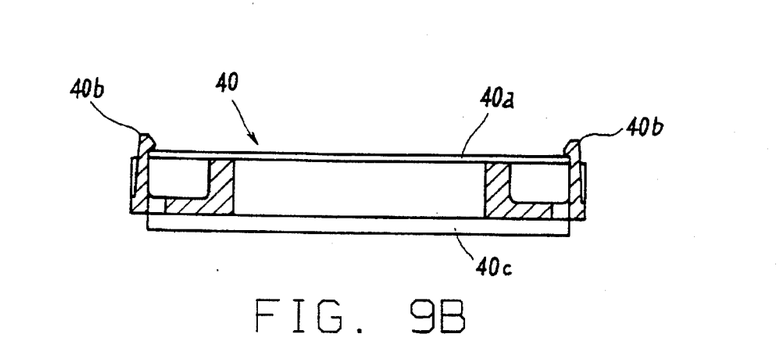
FIG. 9B shows a cross-section view along line B—B of 9A.
Figure 9C:
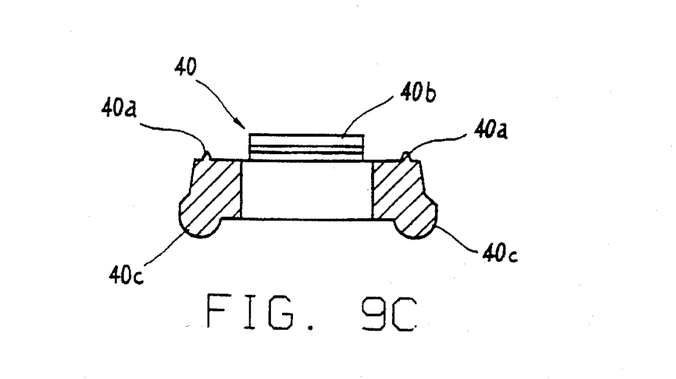
FIG. 9C shows a cross-section view along line C—C of 9A.

FIG. 9 shows the construction of a carrier 40 which is used in connection with the loading of the SOP type IC package 30 in the socket of this invention. FIG. 9A is a plane figure, FIG. 9B is a cross-section cut along line B—B in FIG. 9A and FIG. 9C is a cross-section cut along line C—C in FIG. 9A. This carrier 40 is constructed so that the IC package 30 of the SOP type will be held on the upper surface.

Adjacent the edges on both sides of the top of the carrier 40, a pair of protrusions 40a are provided for positioning or holding the sides of the SOP type IC package 30. On the sides of both ends of the carrier 40, a pair of latches 40b are provided for positioning or holding both ends of the SOP type package 30. At the lower or under side of the carrier 40, on each side a protrusion or outwardly extending surface 40c is provided which extends to an outside position from the center longitudinal axis in a step-like fashion to a greater extent than the end of the upper side surface of the carrier 40. The contour of this curved outer surface 40c corresponds to the curve of the curved part of the J-shaped lead 22 of the IC package 20 of the SOJ type.

Figure 10:
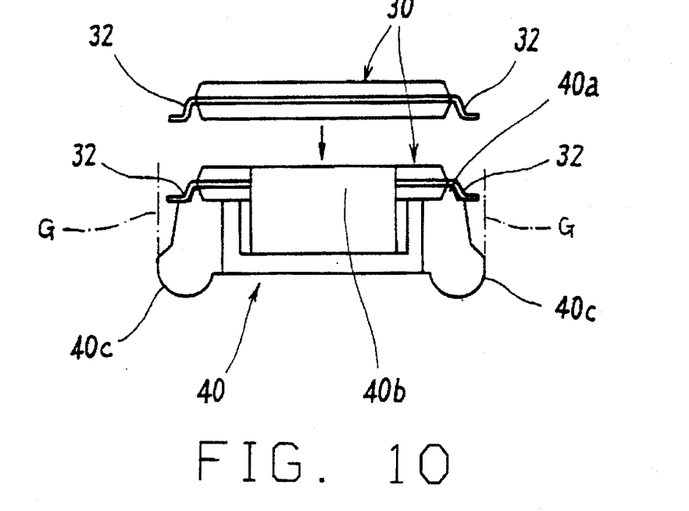
FIG. 10 shows a side view of the manner in which the SOP IC package is held in the carrier of FIG. 9.
Figure 11:
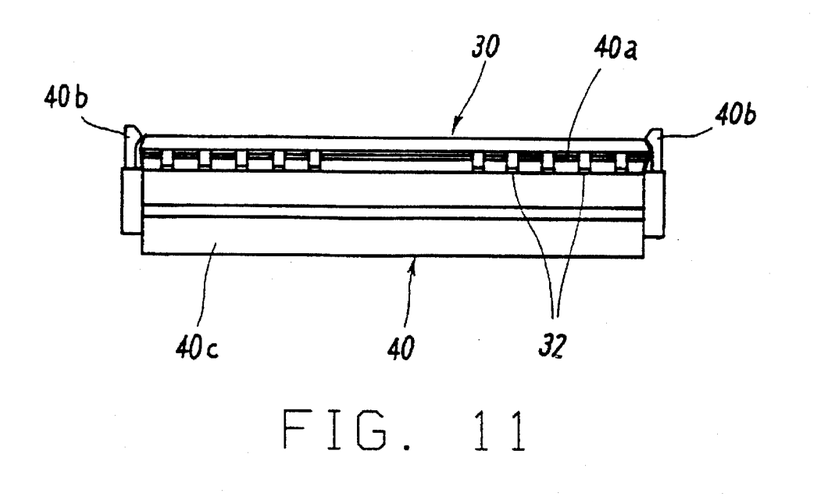
FIG. 11 shows a front view of the SOP IC package in the carrier of FIG. 9.

FIGS. 10 and 11 show the manner in which SOP type IC package 30 is loaded and held on the carrier 40. As is shown in FIG. 10, when SOP type IC package 30 is positioned on the upper surface of the carrier 40, each gull wind shaped lead 32 becomes astride the protrusion 40a. The tip of the leads 32 extend outwardly to a greater degree than both ends of the top surfaces of the carrier 40 with the tip of the lead being thus positioned in the neighborhood but inward of a vertical extension line G of the curved outer surface 40c. As is shown in FIG. 11, both ends of SOP type IC package 30 are elastically held in place by latches 40b.

The action of the socket of the present invention when loading SOP type IC package 30 is explained in FIG. 12. Since the socket 10, IC package 30 and the carrier 40 are constructed to be symmetrical along the central longitudinal axis, FIG. 12 only shows the construction in the left half.

As is shown in FIG. 12A, the carrier 40 is carried by a tool (not shown) such as a carrier arm, etc., to a position which is immediately above the socket with each gull-wing shaped lead 32 of SOP type IC package 30 being positioned above a corresponding contact 12.

When the carrier 40 is lowered vertically, as shown in FIG. 12B, the curved outer surface 40c of the carrier 40 contacts the upper guide part 12f of each contact 12 and slides down its inclined surface.

As curved surface 40c of carrier 40 slides down upper guide part 12f of each contact 12, parts 12c through 12h above the base end 12a of each contact 12 are displaced outward in an elastic manner by the pressure from the carrier 40. As is shown in FIG. 12C, the surface that contacts the curved outer surface 40c of the carrier 40 for each contact 12 moves from the upper guide part 12f to the contact part 12e.

When the carrier 40 is pushed down even further, the curved outer surface 40c of the carrier 40 moves to the lower end of the contact part 12e as is shown in FIG. 12D.

During the time when the curved outer surface 40c of the carrier 40 slides along the upper guide part 12f of each contact 12 and the contact part 12e, there is no contact between the gull-wing shaped lead 32 of the IC package 30 and the contact 12.

When the carrier 40 is further pushed down, the curved outer surface 40c of the carrier 40 moves from being in contact with the lower end of the contact part 12e to the lower guide part 12d. Along with this, each contact 12 is partially restored to its original position and the contact part 12e of each contact 12 contacts and/or slides along the tip of lead 32 of the SOP type IC package 30.

The sliding distance between the contact part 12e and the lead 32 is dependent upon the distance of the movement from the start of the guiding of the curved outer surface 40c of the carrier 40 along the lower guide part 12d to the resting of the lower surface of the carrier 40 on the carrier stand 10b of base 10.

As the tip of the gull-wing shaped lead 32 slides along the contact part 12e of the contact 12 for a suitable distance in this manner, the oxide film at the tip of the lead is peeled off without the lead 32 being given an excessively large stress so as to deform the lead 32 with the consequence that a satisfactory electrical contact is obtained between the two.

Since, as is shown in FIG. 12E, the elastic reaction of the contacts against the IC package 30 works obliquely downward, the IC package 30 and the carrier 40 are stably maintained at the loaded position, even if the external pressure or holding force is removed.

In this case also, the auxiliary linkage part 12h reinforces the spring force of the contact 12 and functions as a current bypass.

The socket in this embodiment is capable of not only directly loading the SOJ type IC package 20, but also loading the SOP type IC package 30 with the use of a carrier 40 as described above. This socket comprises one base 10 and a number of contacts 12 corresponding to the number of the leads of the IC package 20 and 30 with almost all parts in the socket being effectively used in common for the IC packages 20 and 30 with a result that the number of the parts required is small, the construction involved is simple, and a drastic cost reduction is realized.

With the socket in accordance with the present invention, a satisfactory stable and accurate electrical contact is obtained for both the J shaped lead 22 of the SOJ type IC package 20 and the gull-wing shaped lead 32 of the SOP type IC package 30.

Even though the socket of the present invention has been described for common use with SOJ type and SOP type sockets, it could also be used with other electrical parts such as quad flat J-lead packages and quad flat gull wing lead packages.

The structure of the main socket body and the contact in the socket of this invention is not limited to those mentioned in the example, and same can be modified in various ways in conformity with the shape of the IC package and the lead pattern. In addition, the socket of this invention can be used not only in the burn-in test but also as a socket for property and characteristic tests.

Accordingly, the socket of the present invention can be used in common for electrical parts having gull-wing type connection terminals or J shaped connection terminals. It is capable of stably and accurately loading electrical parts by a simple construction with a reduced number of parts involved.

This invention has been described above with reference to specific embodiments; however, it is intended to embrace all such alternative, modifications and variations as fall within the spirit and scope of the appended claims.

I claim:

1. A socket for use in removably loading and making contact with an electrical part, both of the SOJ type with a plurality of connection terminals that extend in the shape of a "J" adapted for use in said socket without a carrier member and of the SOP type with a plurality of connection terminals that extend in a gull-wing shape adapted for use in said socket with a carrier member comprising a main socket body for receiving said electrical part, and a contact means contained within said main socket body including a plurality of contact members arranged at prescribed locations within said main socket body so that each of the plurality of connection terminals of said electrical part can be electrically connected in a one-to-one relationship with one of the plurality of contact members characterized in that each of said contact members has a base portion fixed in said main socket body, an upper and a lower guide portion for guiding said electrical part during loading, a contacting portion positioned between said upper and lower guide portions for making pressure contact with one of the plurality of connective terminals of said electrical part while being elastically displaced, a connective portion that integrally connects one end of said base portion and said upper guide, lower guide and contact portions and an auxiliary laterally movable connective portion that extends from another end of said base portion and is connectable with said contacting portion and upon deflection increases the spring force of said contact member.

2. A socket according to claim 1 wherein said main socket body includes a mounting platform for holding said electrical part when mounted in said socket.

3. A socket according to claim I wherein said carrier for use with said SOP type socket with gull-wing type connection terminals has a contacting means that extends outward past the outer most tip of said plurality of connection terminals of said electrical part so as to contact said plurality of said contact members prior to said plurality of connection terminals connecting said plurality of contact members.

4. A socket according to claim 3 wherein during loading of said electrical part on said carrier said contacting means enters said main socket body prior to said electrical part and engages first said upper guide portion of said contact member, second, the contact portion of said contact member and finally the lower guide portion of said contact member which then allows contacting by said plurality of contact members with said plurality of connective terminals.

5. A socket according to claim 1 in which each of said plurality of contact members further includes an engagement portion at one distal end to properly elastically position each contact is said main socket body and a contact pin portion at the other distal end attached to the base portion and protruding from the main socket body.

6. A socket according to claim 1 wherein said main socket body has a central cavity for receiving the electrical part with two side walls with a plurality of cavities for receiving said plurality of contact members.

7. A socket comprising a main socket body for removably loading an electrical part having a package that accommodates an electrical circuit and a plurality of connection terminals that protrude in a given pattern of arrangement from the sides of the said package, a carrier for holding said electrical part having an outer portion extending to a location outside the outer most tip of said plurality of connection terminals and a plurality of contact members that have been arranged at prescribed locations inside said main socket body, each to be connected electrically in a one-to-one relationship to one of said plurality of connection terminals, characterized in that each of said contact members has a base that is fixed to said main socket body, a contact part which includes an upper and lower guide portion for directly engaging and guiding outer surfaces of said carrier while being elastically displaced and a contact portion which extends between the upper and lower guide portions for making an electrical pressure contact with one of said plurality of connection terminals of said electrical parts and a connective part that integrally connects said base and said contact part.

8. A socket as described in claim 7, wherein the connective part of said contact member has a first portion which extends from one end of said base and which is integrally formed with said contact part and a second portion which extends from the outer end of said base and which is connectable to said first connective portion.

* * * * *